(12) United States Patent
Morita et al.

(10) Patent No.: US 7,250,766 B2
(45) Date of Patent: Jul. 31, 2007

(54) GRADIENT COIL APPARATUS FOR MAGNETIC RESONANCE IMAGING SYSTEM

(75) Inventors: Hiroshi Morita, Mito (JP); Ryozo Takeuchi, Hitachi (JP); Akira Kurome, Kashiwa (JP); Takeshi Yatsuo, Kashiwa (JP); Hirotaka Takeshima, Ryugasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/444,309

(22) Filed: Jun. 1, 2006

(65) Prior Publication Data
US 2006/0279285 A1 Dec. 14, 2006

(30) Foreign Application Priority Data
Jun. 2, 2005 (JP) ............................. 2005-162312

(51) Int. Cl.
*G01V 3/00* (2006.01)
(52) U.S. Cl. ..................................... 324/318
(58) Field of Classification Search ................. 324/318
See application file for complete search history.

(56) References Cited

U.S. PATENT DOCUMENTS 6,771,072 B2 * 8/2004 Schuster et al. ............ 324/318
6,774,631 B2 * 8/2004 Heid .......................... 324/318

FOREIGN PATENT DOCUMENTS

JP 11-225983 8/1999

\* cited by examiner

*Primary Examiner*—Brij Shrivastav
*Assistant Examiner*—Megann E Vaughn
(74) *Attorney, Agent, or Firm*—Mattingly, Stanger, Malur & Brudidge, P.C.

(57) ABSTRACT

A gradient coil apparatus for magnetic resonance imaging system includes a plurality of gradient coils 11a, 11b and 11c for applying a gradient magnetic field to a test object and an internal heat exchanger 14 to be immersed in insulation oil 13 in a container 12. A pump 16 is disposed to circulate coolant between the internal heat exchanger 14 and an external heat exchanger 15 is disposed outside of the container 12. This arrangement allows the insulation oil only inside of the container, thereby ensuring a substantial reduction in the amount of insulation oil.

4 Claims, 4 Drawing Sheets

GRADIENT COIL APPARATUS FOR MAGNETIC RESONANCE IMAGING SYSTEM

CLAIM OF PRIORITY

THE PRESENT APPLICATION CLAIMS PRIORITY FROM JAPANESE APPLICATION SERIAL NO. 2005-162312, FILED ON JUN. 2, 2005, THE CONTENTS OF WHICH IS HEREBY INCORPORATED BY REFERENCES INTO THIS APPLICATION.

BACKGROUND OF THE INVENTION

1. Field of the Invention

The present invention relates to a gradient coil apparatus for magnetic resonance imaging system (MRI system).

2. Prior Art

There has been a growing demand for higher speed in diagnosis and higher definition in diagnostic image. The gradient magnetic field performance has been improved in the ever-enhancing performance of the magnetic resonance imaging system.

The gradient magnetic field is generated in the form of pulses based on a given sequence. To increase the diagnostic speed, it is necessary to reduce the time for reaching the desired magnetic field (it is for turning on the gradient coil must be reduced. To cut down the rise time, a high voltage must be applied to the coil. Further, the insulation performance must be enhanced since a high voltage is produced among the gradient coils for X, Y and Z axes.

To enhance the precision of a diagnostic image, it is necessary to increase the magnetic field gradient. To increase the magnetic field gradient, it is necessary to increase the current to be applied. However, this causes an increase in the Joule heat of the gradient coil. Further, the coil configuration is getting increasingly complicated. To avoid local overheating, a magnetic resonance imaging system equipped with a gradient coil cooling apparatus is coming into general use.

As described above, increased coil voltage and increased Joule heat have become the salient features of a gradient coil apparatus. In the gradient coil apparatus, a plurality of coils have been molded into one integral structure with a solid insulation member. The heat exchanger for cooling the coil when required is also molded into one integral structure with the coils.

However, to enhance insulation performance to cope with the increasing coil voltage, the solid insulation member must be made thicker. To cope with the increasing Joule heat, the solid insulation member must be made thin in order to reduce the thermal resistance between the coil and heat exchanger. To be more specific, the improvement of the electric insulation performance is incompatible with the improvement of the cooling performance.

One of the techniques of improving the electrical insulation performance and cooling performance is disclosed in the Patent Document 1, wherein a gradient coil is immersed in insulation oil and insulation oil is subjected to controlled circulation using a heat exchanger located outside the gradient coil, whereby improvement of both the electric insulation performance and cooling performance is achieved.

[Patent Document 1] Japanese Application Patent Laid-open Publication No. Hei 11-225983

SUMMARY OF THE INVENTION

Problems to be Solved by the Invention

The Patent Document 1 requires an insulation oil circulation apparatus, heat exchanger and oil pipe to be installed outside the gradient coil apparatus to provide controlled circulation of the insulation oil. In a magnetic resonance imaging system wherein a strong magnetic field is generated and the external strong magnetic field is generated and the external vibration must be cut off, the aforementioned circulation apparatus and related equipment are required to be installed away from the portion generating a strong magnetic field. This requires use of a longer oil pipe, and necessarily increases the amount of insulation oil stored in the magnetic resonance imaging system. The insulation oil is classified as a hazardous material from the viewpoint of fire prevention. Storage of a large amount of insulation oil may raise problems in an examination room of a hospital equipped with the magnetic resonance imaging system.

In the meantime, the insulation oil is subjected to controlled circulation, bubbles may be generated in the insulation oil. Since bubbles are characterized by a lower discharge voltage than the insulation oil, the performance of the insulation oil may be deteriorated by generation of bubbles.

The object of the present invention is to provide a gradient coil apparatus for magnetic resonance imaging system that ensures a substantial reduction in the amount of insulation oil and prevents eterioration of the insulation oil.

Means for Solving the Problems

The present invention for achieving the aforementioned object provides a gradient coil apparatus installed in a static magnetic field of a magnetic resonance imaging system (MRI system), the gradient coil apparatus comprising a plurality of gradient coils for applying a gradient magnetic field to a test object; wherein a container includes: a plurality of gradient coils immersed in insulation oil in this container; and an heat exchanger for allowing exchange of heat between the coolant supplied from outside the gradient coil apparatus and the insulation oil.

In the aforementioned apparatus, a coolant is circulated instead of controlled circulation of insulation oil, and heat is exchanged between the coolant and insulation oil by a heat exchanger installed inside the gradient coil apparatus. This arrangement allows the insulation oil only inside the gradient coil apparatus, thereby ensuring a substantial reduction in the amount of insulation oil. Further, controlled circulation of insulation oil is not adopted, and therefore, no bubble is generated in the insulation oil and no deterioration of insulation performance occurs.

The present invention provides another gradient coil apparatus installed in a static magnetic field of a magnetic resonance imaging system (MRI system), the gradient coil apparatus comprising a plurality of gradient coils for applying a gradient magnetic field to a test object; wherein a plurality of gradient coils immersed in insulation oil in a container and at least one of the gradient coils are made of a metallic tube, and the coolant supplied from outside the container flows through the metallic tube to exchange heat with the insulation oil.

In addition to the aforementioned characteristics, this apparatus is further characterized in that the heat exchanger and gradient coil are formed in an integral structure. This arrangement allows the gradient coil apparatus to be downsized.

In the present invention, a plurality of gradient coils wherein the direction of the static magnetic field is orthogonal to that of the gradient magnetic field at the position of a test object are molded into one integral structure with a solid insulation member.

In addition to the characteristics mentioned above, this apparatus is further characterized as follows: For example, when coils having a similar shape are the X-and Y-axis gradient coils arranged 90 degrees rotated about the central axis, these coils can be arranged close to each other after having been provided with insulation using a strong solid insulation member. This arrangement allows the gradient coil apparatus to be downsized. Further, since both the gradient coils can be arranged close to each other, the distribution of the magnetic field having been generated can be regarded as equivalent. Thus, the magnetic field for determining the coil shape need not be calculated for each coil, and this reduces the designing time.

Effects of the Invention

The present invention provides a gradient coil apparatus for magnetic resonance imaging system (MRI system) wherein insulation oil is stored inside the coil apparatus. This structure ensures a substantial reduction in the amount of oil. Further, controlled circulation of insulation oil is not adopted, and therefore, no bubble is generated in the insulation oil and no deterioration of insulation performance occurs. Further, the aforementioned advantage ensures compatibility between the insulation performance and cooling performance.

DETAILED DESCRIPTION OF THE INVENTION

Description of the Preferred Embodiments

The following describes a plurality of embodiments of the present invention: The common structures of the magnetic field generation device of a magnetic resonance imaging system (MRI system) will be described first. In the present embodiment, the horizontal magnetic field type wherein the test object and static magnetic field are oriented in the same direction will be described. The present invention is also applicable to the vertical magnetic field type wherein the direction of the test object is orthogonal to that of the static magnetic field.

Figure 2:
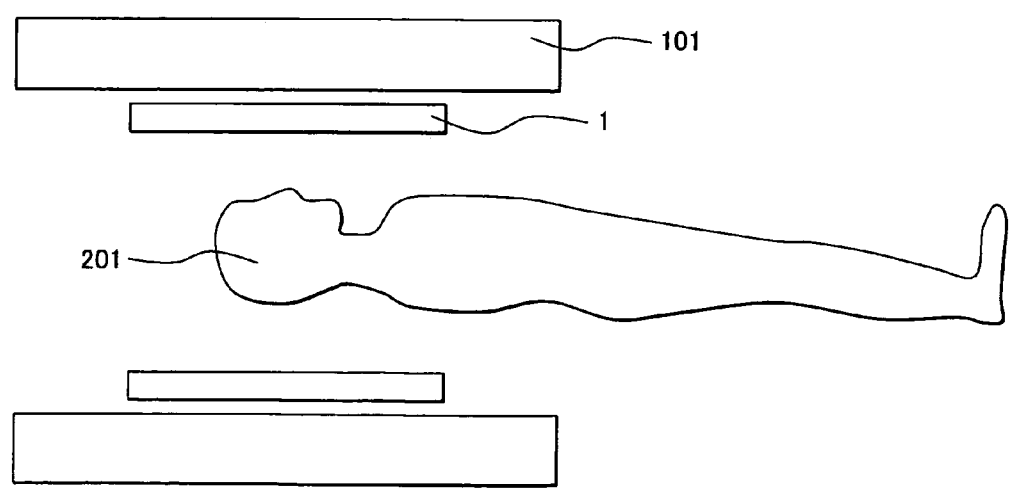
FIG. 2 is a layout drawing representing the magnetic field generating apparatus in the MRI apparatus.

FIG. 2 is a layout drawing representing the magnetic field generation device of an MRI system. The static magnetic field generation device 101 generates static magnetic field at a..desired position of the test object 201. Any one of a permanent magnet, a superconducting coil and a non-superconducting coil, or the combination thereof is used as a source for generating the static magnetic field. The static magnetic field allows a nuclear magnetic resonance to be generated on the test object 201. The resonance frequency is proportional to the intensity of the static magnetic field. The proportional constant differs according to the atom. In the case of a hydrogen atom, for example, the resonance frequency is 100 MHz when the magnetic field intensity is 2.34 T. The uniform static magnetic field is required in a desired area of the test object 201. The tolerance is in the order of one millionth in a spherical body having a diameter of 30 cm.

The gradient coil apparatus 1 is installed between the static magnetic field generation device 101 test object 201, and generates a gradient magnetic field at a desired position of the test object 201. The gradient magnetic field is used to specify a site where the nuclear magnetic resonance is to be produced, and to erase the state of resonance.

In the diagnosis by the magnetic resonance imaging system, a gradient magnetic field is superimposed on the static magnetic field to delimit the range of excitation and to acquire spatial position information for the magnetic resonance signal. Three different types of gradient magnetic fields are used according to the particular requirement. They are: (1) Z-axis gradient magnetic field where the spatial direction of the gradient is parallel to the static magnetic field; (2) X-axis gradient magnetic field where the gradient of the magnetic field is orthogonal to the static magnetic field; and (3) Y-axis gradient magnetic field where the gradient of the magnetic field is orthogonal to the static magnetic field and X axis. A set of three types of gradient coils corresponding to three axes is molded by a solid insulation member and built as a gradient coil apparatus into the MRI system.

Figure 6:
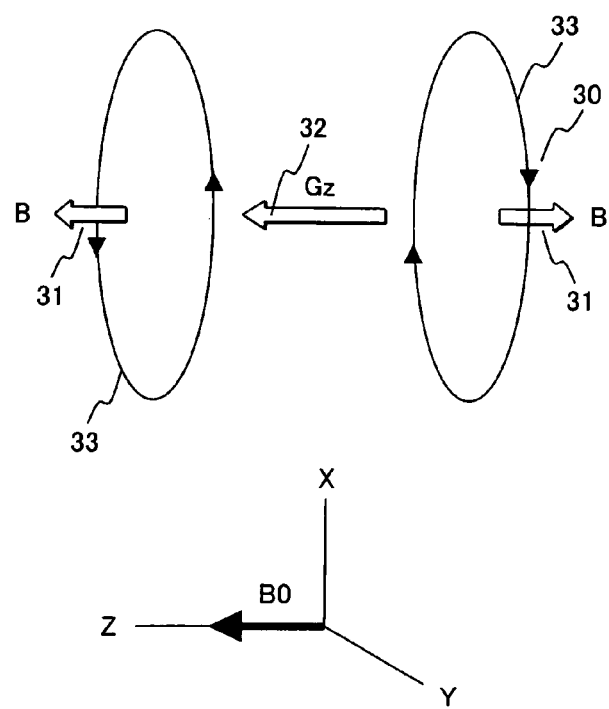
FIG. 6 is a schematic diagram representing the Z-axis gradient coil in the MRI apparatus.
Figure 7:
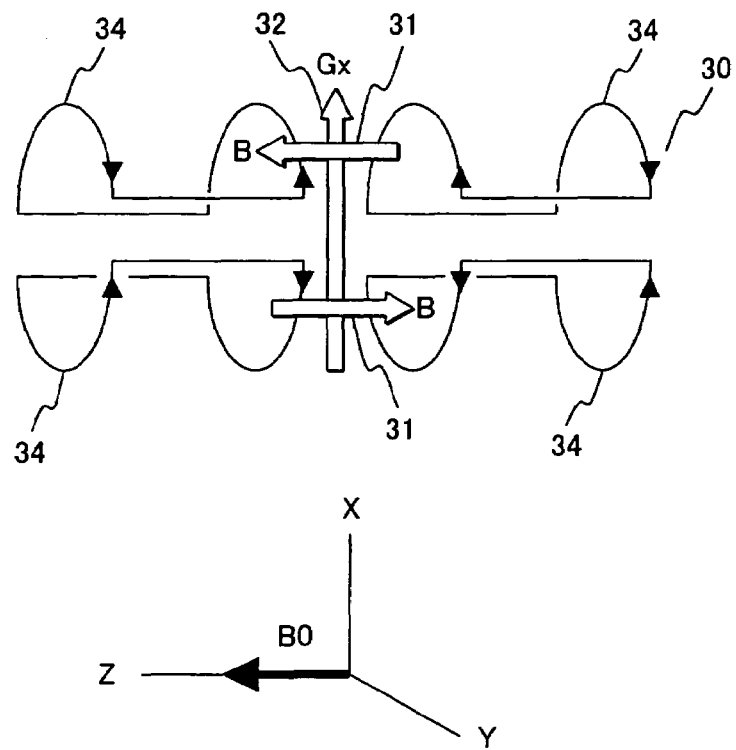
FIG. 7 is a schematic diagram representing the X-axis gradient coil in the MRI apparatus.
Figure 8:
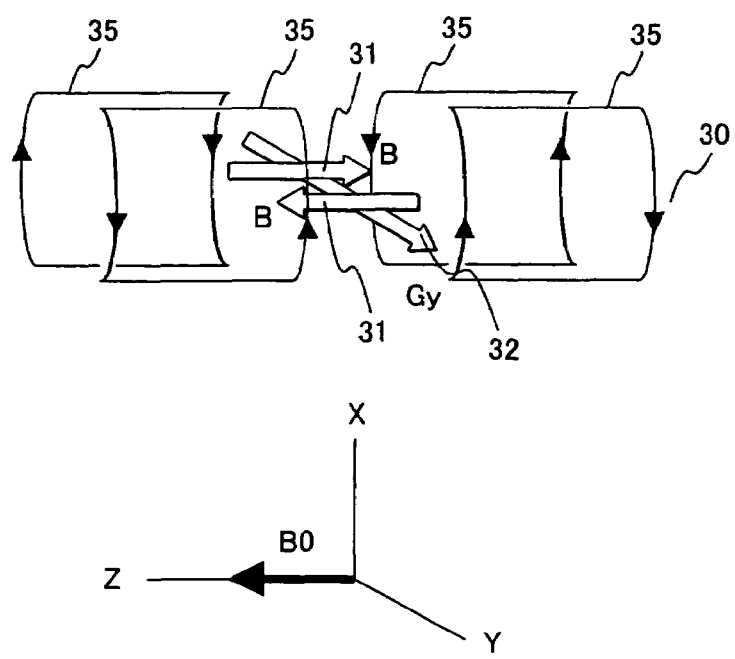
FIG. 8 is a schematic diagram representing the Y-axis gradient coil in the MRI apparatus.

FIG. 6 represents a typical example of a Z-axis gradient coil in a horizontal magnetic field type MRI system, FIG. 7 represents a typical example of a X-axis gradient coil, and FIG. 8 represents a typical example of a Y-axis gradient coil. In these figures, the coil is represented as a one-turn circular coil or a saddleback coil. In actual practice, the coil may be a multi-turn coil or may have a different configuration.

In a horizontal magnetic field type MRI system in FIG. 6, the static magnetic field BO is positioned in the direction of Z axis. When a current is applied to the Z-axis gradient coil 33, each coil produces a magnetic field in the magnetic direction 31, and gradient magnetic field Gz is produced by the superimposition thereof in the direction of the gradient magnetic field 32 (Z-axis direction), wherein the aforementioned gradient magnetic field Gz has its magnetic field intensity inclined. Similarly, in FIG. 7, when a current is applied to the X-axis gradient coil 34, a gradient magnetic field Gx is produced in the direction of the gradient magnetic field 32 (X-axis direction). In FIG. 8, when a current is applied to the Y-axis gradient coil 35, a gradient magnetic field Gy is produced in the direction of the gradient magnetic field 32 (Y-axis direction). These gradient magnetic fields 32 are used to delimit the range of excitation, and to acquire spatial position information for the magnetic resonance signal.

As described above, a MRI system of vertical magnetic field type is also available. A magnet for producing a static magnetic field and the test object are differently arranged, and therefore, the gradient coil has also a different profile. The MRI system of vertical magnetic field type is basically the same as the MRI system of horizontal magnetic field type in that gradient magnetic fields are produced in the direction of X, Y and Z axes.

Embodiment 1

Figure 1:
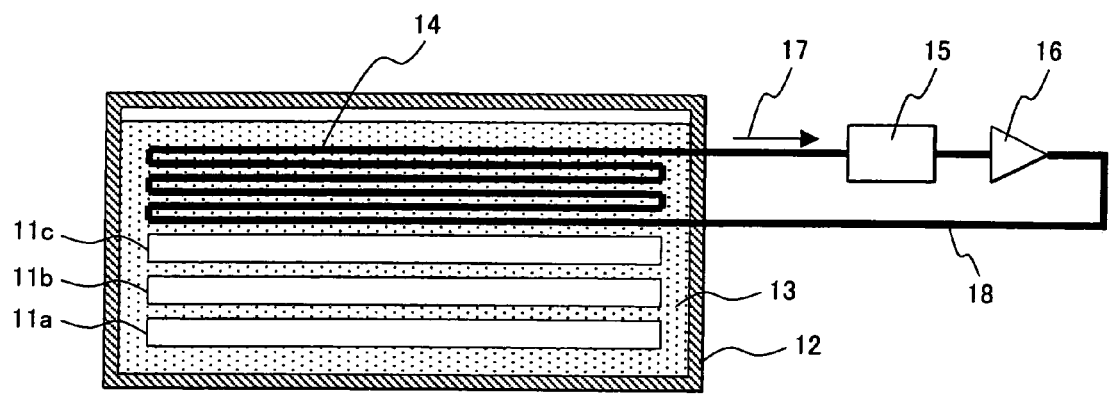
FIG. 1 is a schematic diagram representing the internal structure of the gradient coil apparatus as a first embodiment of the present invention.

The following describes the gradient coil with reference to the first embodiment of the present invention. FIG. 1 schematically represents the internal structure of the gradient coil apparatus. The X-axis gradient coil 11a, Y-axis gradient coil 11b and Z-axis gradient coil 11c are incorporated in the gradient coil container 12. The gradient coil 11 generates gradient magnetic field in each axial direction. In this case, the Z axis denotes the direction in parallel with the static magnetic field, the X axis denotes the direction orthogonal to the Z axis, and the Y axis denotes the direction orthogonal to the Z and X axes. Each gradient coil is connected with the power supply and generates Joule heat when power is supplied according to a desired sequence.

Each gradient coil is immersed in the insulation oil 13 reserved in the gradient coil container 12. Mineral oil and silicone are preferably used as the insulation oil 13 because of a high electric resistance, a sufficient flowability in the temperature range for use and a high resistance to vaporization. The gradient, coil container 12 is designed in an airtight structure to prevent the insulation oil 13 from leaking, and is made of a non-magnetic metal or resin.

The internal heat exchanger 14 is connected to the external heat exchanger 15 installed out of the gradient coil apparatus and a circulation pump 16 using a pipe 18. The coolant is circulated in the circulation direction 17. A liquid such as water and chlorofluorocarbon alternative is preferably used as the coolant. In the external heat exchanger 15 and circulation pump 16, the order of the coolant flow may be replaced.

In the internal heat exchanger 14, heat is exchanged between the insulation oil 13 and coolant. An example of the internal heat exchanger 14 is found in the structure wherein the coolant flows through a bent metallic pipe. In this structure, when power is supplied to the gradient coils 11a, 11b and 11c, an induced electromotive force may occur to the internal heat exchanger. To prevent this, means are provided to ensure that induction does not occur, the pipe is made of a highly electrical resistance material, and an insulated position is provided at a given place of the pipe.

The external heat exchanger 15 ensures that the coolant whose temperature has been raised by heat exchange with the insulation oil 13 by means of the internal heat exchanger 14 is cooled by heat exchange with the atmosphere. The circulation pump 16 causes the coolant to circulate.

When the aforementioned structure is adopted, the Joule heat generated by the gradient coils 11a, 11b and 11c is transmitted to the insulation oil 13 by natural convection. Heat is exchanged with the coolant by the internal heat exchanger 14, and with the atmosphere through the external heat exchanger 15. Thus, the gradient coil is maintained at a constant temperature without being overheated. Further, the insulation oil 13, without being overheated, maintains a higher insulation resistance as an insulator than that when a solid insulator such as a resin is used.

The insulation oil 13 is left to natural convection and heat is exchanged by an internal heat exchanger 14. This arrangement eliminates the need of controlled circulation by an external circulation pump. Thus, the external heat exchanger, circulation pump and pipe need not be filled with insulation oil. This arrangement reduces the amount of insulation oil. Further, since the insulation oil is not subjected to controlled circulation, there is no possibility of the air bubbles mixing with the insulation oil, with the result that the dielectric strength is subsequently improved.

Embodiment 2

The following describes the second embodiment of the present invention. The arrangement of the magnetic field generating apparatus in an MRI imaging apparatus is the same as that shown in FIG. 2.

Figure 3:
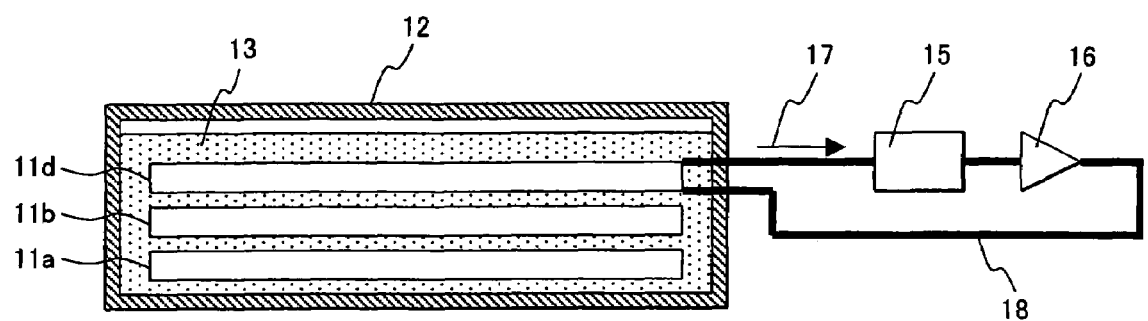
FIG. 3 is a schematic diagram representing the internal structure of the gradient coil apparatus as a second embodiment of the present invention.

FIG. 3 schematically represents the internal structure of the gradient coil apparatus as a second embodiment. The X-axis gradient coil 11a, Y-axis gradient coil 11b and Z-axis gradient coil 11d are incorporated in the gradient coil container 12. Each gradient coil is immersed in the insulation oil 13. The gradient coils generate gradient magnetic field in respective axial directions. In this case, the Z axis denotes the direction in parallel with the static magnetic field, the X axis denotes the direction orthogonal to the Z axis, and the Y axis denotes the direction orthogonal to the Z and X axes. The Z-axis gradient coil 11d also served as the internal heat exchanger 14 of the first embodiment.

Figure 4:
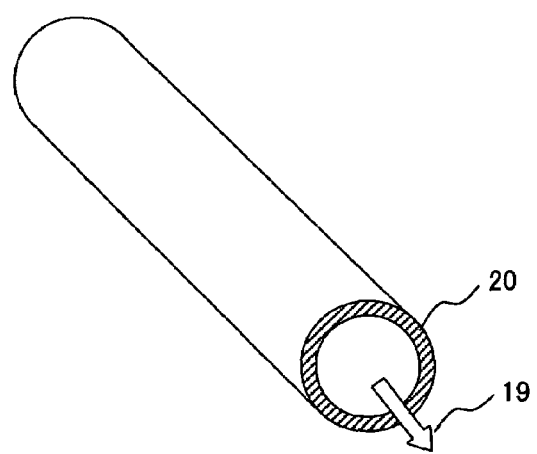
FIG. 4 is a schematic diagram representing the Z-axis coil conductor in the second embodiment.

The Z-axis gradient coil 11d is designed in a structure wherein the coolant flows through a bent metallic pipe. FIG. 4 shows an example of the structure of the Z-axis coil conductor. The Z-axis coil winds the conductor 20 and is structured in such a way as to allow passage of the coolant 19. The cross sectional view of the conductor 20 indicates a circular pipe. The conductor 20 can be formed in a rectangular or any other structure if it allows passage of coolant inside. The conductor 20 is metallic, but can be covered with an insulator.

The Z-axis gradient coil 11d is connected to the external heat exchanger 15 installed out of the gradient coil apparatus 12 and a circulation pump 16 using a pipe 18. The coolant is circulated in the circulation direction 17. In the Z-axis gradient coil 11d, heat is exchanged between the coil and coolant, and between the insulation oil 13 and coolant. The external heat exchanger 15 allows heat to be exchanged with the insulation oil 13 through the Z-axis gradient coil 11d, with the result that the heated coolant is cooled by heat exchange with the atmosphere. Otherwise, the structure is the same as that of the first embodiment. The gradient coil made up of a metallic pipe preferably generates a gradient magnetic field having a gradient parallel to that of the static magnetic field B in the test object 201. In the present embodiment, the easiest way is to use the Z-axis coil 33 parallel to the static magnetic field B according to FIG. 6.

When the aforementioned structure is adopted, the Joule heat produced by the gradient coils 11a and 11b is transmitted to the insulation oil 13 by natural convection. After that, the heat is exchanged with coolant through the gradient coil 11d also serving as an internal heat exchanger. Then heat is exchanged between the coolant and atmosphere by the external heat exchanger 15. Thus, the gradient coil is maintained at a constant temperature without being overheated. Further, the insulation oil 13, without being overheated, maintains a higher insulation resistance as an insulator than that when a solid insulator such as a resin is used.

The above description refers to the structure wherein the coolant passes through the conductor of the Z-axis gradient coil 11d. The X-axis and Y-axis gradient coils can have the same structure, or can be designed in such a way that the coolant passes through a plurality of coils. When the coolant passes through a plurality of coils, the coolant flow can be either serial or parallel. However, these flows must be electrically isolated with one another.

Since the aforementioned structure ensures that the Z-axis gradient coil 11d of the first embodiment also serves the function of the internal heat exchanger 14, downsizing of the gradient coil apparatus can be achieved. This is another characteristic provided by the aforementioned structure, in addition to the characteristics shown with reference to the first embodiment.

Embodiment 3

Figure 5:
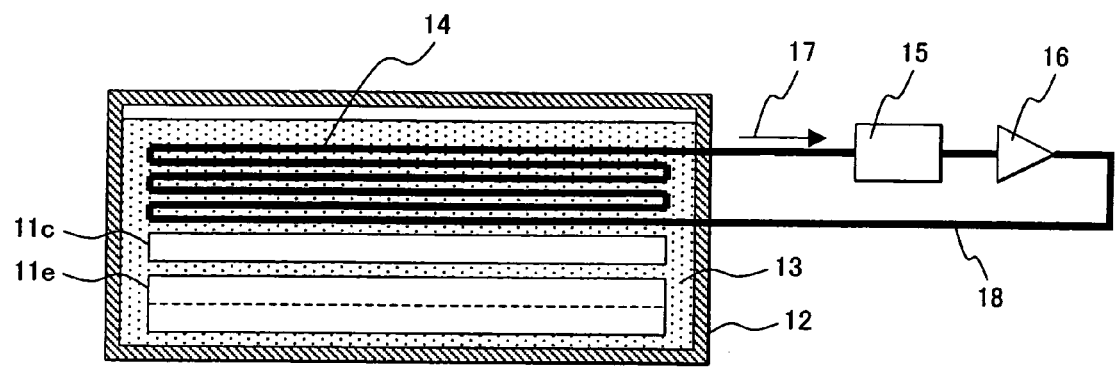
FIG. 5 is a schematic diagram representing the internal structure of the gradient coil apparatus as a third embodiment of the present invention.

The following describes the third embodiment of the present invention. FIG. 5 schematically represents the internal structure of the gradient coil apparatus as a third embodiment. The X-axis gradient coil 11a and the Y-axis gradient coil 11b are integrally molded into one structure 11e by a solid insulation member such as a resin. Together with the Z-axis gradient coil 11c, they are incorporated into the gradient coil container 12. The gradient coils generate gradient magnetic field in respective axial directions. In this case, the Z axis denotes the direction in parallel with the static magnetic field, the X axis denotes the direction orthogonal to the Z axis, and the Y axis denotes the direction orthogonal to the Z and X axes.

In the internal heat exchanger 14, heat is exchanged between the insulation oil 13 and coolant. An example of the internal heat exchanger 14 is found in the structure wherein the coolant flows through a bent metallic pipe. In this structure, when power is supplied to the gradient coils 11e and 11c, an induced electromotive force may occur to the internal heat exchanger. To prevent this, means are provided to ensure that induction does not occur, the pipe is made of a highly electrical resistance material, and an insulated position is provided at a given place of the pipe. Otherwise, the structure is the same as that of the first embodiment. That is, the internal heat exchanger 14 is connected to the external heat exchanger 15 installed out of the gradient coil apparatus and a circulation pump 16 using a pipe 18. The coolant is circulated in the circulation direction 17. A liquid such as water and chlorofluorocarbon alternative is preferably used as the coolant. In the external heat exchanger 15 and circulation pump 16, the order of the coolant flow may be replaced.

The aforementioned description refers to the structure provided with the internal heat exchanger 14, as shown with reference to the first embodiment. It is also possible to design a structure wherein the coolant is made to flow inside the Z-axis gradient coil, as shown with reference to the second embodiment, so that the functions of both the internal heat exchanger a given gradient coil can be performed.

If the gradient coil integrally molded in one structure generates a gradient magnetic field in the direction orthogonal to that of the magnetic field B in the test object 201, assembling will be facilitated. A combination between the X-axis gradient coil 34 of FIG. 7 and the Y-axis gradient coil 35 of FIG. 8 is used in the present embodiment.

In addition to the characteristics described with reference to the first and second embodiments, the following characteristic is provided by the aforementioned structure: After the X-axis gradient coil and the Y-axis gradient coil have been insulated with a rigid solid insulation member, they can be brought closer to each other and can be installed. This arrangement permits downsizing of the gradient coil apparatus. Further, since the X-axis gradient coil and the Y-axis gradient coil can be brought closer to each other and can be installed, the magnetic fields having been generated can be regarded to have the equivalent distribution. This eliminates the need of calculating the magnetic field for each coil to determine the coil configuration, with the result that a subsequent reduction of the designing time has been achieved.

What is claimed is:

1. A gradient coil apparatus for a magnetic resonance imaging system comprising;
   a plurality of gradient coils installed in a static magnetic field of a magnetic resonance imaging system for applying a gradient magnetic field to a test object;
   a container having insulation oil therein; and
   an internal heat exchanger having a metallic pipe for flowing coolant therethrough, installed inside of the container for allowing exchange of heat between the coolant supplied from an external heat exchanger for cooling the coolant, installed outside of the gradient coil apparatus, and the insulation oil in the container, and wherein
   the plurality of gradient coils is disposed in the container and immersed in the insulation oil in the container for cooling the gradient coils.

2. A gradient coil apparatus for a magnetic resonance imaging system comprising;
   plurality of gradient coils installed in a static magnetic field of a magnetic resonance imaging system for applying a gradient magnetic field to a test object; and
   a container having insulation oil therein, wherein the plurality of gradient coils is disposed in the container and immersed in the insulation oil in the the container and at least one of the gradient coils is made of a metallic tube as an internal heat exchanger for allowing exchange of heat between a coolant supplied from an external heat exchange for cooling the coolant, installed outside of the container, which flows through the metallic tube, and the insulation oil in the container for cooling the gradient coil.

3. A gradient coil apparatus for a magnetic resonance imaging system according to claim 2, wherein at least two of the gradient coils are molded into one integral structure with a solid insulation member.

4. A gradient coil apparatus for a magnetic resonance imaging system according to claim 1, wherein a coil winding of at least one of the gradient coils is molded into one integral structure with a solid insulation member, and the at least one gradient coil generates a gradient magnetic filed in a direction parallel to or orthogonol to a static magnetic field.

* * * * *